United States Patent [19]

Cuomo et al.

[11] 4,352,117

[45] Sep. 28, 1982

[54] ELECTRON SOURCE

[75] Inventors: Jerome J. Cuomo, Lincolndale; Russell W. Dreyfus, Mount Kisco; Jerry M. Woodall, Bedford Hills, all of N.Y.

[73] Assignee: International Business Machines Corporation, Armonk, N.Y.

[21] Appl. No.: 155,729

[22] Filed: Jun. 2, 1980

[51] Int. Cl.³ .............................................. H01L 27/14

[52] U.S. Cl. ........................................ 357/30; 357/16; 357/52

[58] Field of Search .............................. 357/30, 52, 16

[56] References Cited

U.S. PATENT DOCUMENTS

| | | | |
|---|---|---|---|
| B 309,756 | 1/1975 | Kressel | 148/171 |
| 3,667,007 | 5/1972 | Kressel et al. | 357/52 |
| 3,696,262 | 10/1972 | Antypas | 313/94 |
| 3,699,404 | 10/1972 | Simon et al. | 357/52 X |
| 3,808,477 | 4/1974 | Swank | 357/52 X |
| 3,959,037 | 5/1976 | Gutierrez | 148/171 |
| 3,972,060 | 7/1976 | Hara et al. | 357/30 |
| 3,972,750 | 8/1976 | Gutierrez et al. | 357/16 X |
| 4,040,074 | 8/1977 | Hara et al. | 357/16 |
| 4,040,079 | 8/1977 | Hara et al. | 357/30 |
| 4,040,080 | 8/1977 | Hara et al. | 357/30 |

FOREIGN PATENT DOCUMENTS

| | | |
|---|---|---|
| 1275972 | 6/1972 | United Kingdom . |
| 1476471 | 6/1977 | United Kingdom . |

OTHER PUBLICATIONS

Schade et al., *Appl. Phys. Lett.*, vol. 20, No. 10, May 15, 1972, p. 385.

Nelson et al., *App. Phys.* 49(12), Dec. 1978, p. 6103.

Carr, *Nature*, Mar. 27, 1980, p. 5.

*Primary Examiner*—Martin H. Edlow

*Attorney, Agent, or Firm*—Alvin J. Riddles

[57] ABSTRACT

A high brightness, essentially monoenergetic electron source is constructed in solid state material by providing a semiconductor body with an electron confinement barrier over most of the surface, the barrier having a relatively small opening exposing the semiconductor body, in the relatively small opening a material is placed in contact with the semiconductor body that has a work function that is lower than the energy of excited electrons in the semiconductor. In this structure electrons from hole-electron pairs generated in the semiconductor are repelled and recombination is inhibited by the barrier except in the relatively small opening where they are injected into the surrounding environment through the lower work function material. The hole-electron pair generation may be by irradiation or by electrical injection. The electron source is useful for such applications as high brightness sources, digital communications, cathode ray tube electron sources and scanning electron microscopes.

10 Claims, 7 Drawing Figures

ELECTRON SOURCE

DESCRIPTION

1. Technical Field

The technical field of the invention is the field of cold cathode or solid state electron emitting devices, known in the art as negative electron affinity devices. In such devices electrons are emitted as a result of the physical properties of the device material such as a semiconductor. Such a device avoids the heat and associated electrical problems that are present in the prior art electron sources which use thermionic emission in order to drive electrons off.

2. Background Art

Solid state cold cathode or electron emitting sources have been built in the art employing a technique of directing electrons from hole-electron pairs present in a semiconductor structure into a surrounding vacuum through a region of material on the surface of the semiconductor that has a lower work function than that of the excited electrons in the semiconductor. The lower work function material is known in the art as a negative electron affinity material. One such structure is in U.S. Pat. No. 4,040,074 wherein limited area electron emission is achieved using an insulating member placed on the surface of a semiconductor surrounding the region of material having the low work function. Another such structure is shown in Applied Physics Letters, Vol. 20, No. 10, May 15, 1972. In this structure current flow is confined to a small area inside the device using diffused regions and emission then occurs from an upper heterolayer and through an area of negative electron affinity material that is the same size as the area of confined current flow.

At the present state of the art, however, there is a limit to the brightness of such devices due to limits on the effective generation of hole-electron pairs and the transportation of the electrons to the emission area.

DISCLOSURE OF THE INVENTION

The invention involves a semiconductor structure with an electron confinement barrier. An opening is provided in the barrier exposing the semiconductor and a negative electron affinity material is provided positioned in contact with the exposed portion of the semiconductor. The semiconductor is provided with a long carrier lifetime and diffusion length.

With this structure, non equilibrium electrons from hole-electron pairs generated in the semiconductor are repelled by the barrier, recombination is inhibited and the electrons are confined in the semiconductor until they reach the opening with the negative electron affinity material at which point they are ejected into the surrounding environment. The longer the "carrier lifetime" property and the longer the "diffusion length" property of the semiconductor, the greater will be the quantity of electrons that will reach the opening and be ejected into the surrounding environment. As electrons are ejected, a concentration gradient appears near the opening which operates to sweep electrons in the direction of the opening.

The structure thus converts energy within the semiconductor into an essentially monoenergetic electron beam source which can be precisely deflected and focused for use in such devices as high brightness electron sources, digital communications, and instrument and cathode ray tube display electron sources.

The elements of the structure operate in combination to provide a condition where a larger region is provided for induced carrier current than the emitting region so that a higher density of emitted current results.

Figure 1:
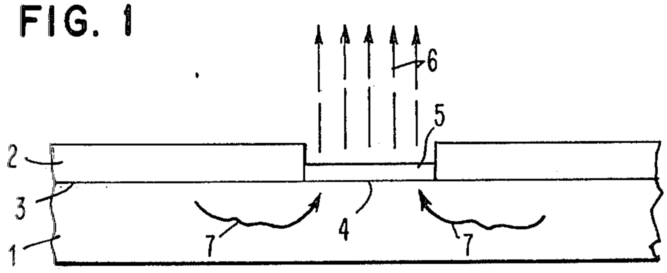
FIG. 1 is a schematic illustration of the elements of the invention.

Referring to FIG. 1 a semiconductor device body 1 having the property of good electron lifetime and good diffusion length is provided.

A layer 2 is applied over the semiconductor body 1 forming a barrier 3 with the semiconductor body 1 that is operable to confine electrons to the semiconductor material. The barrier inhibits electron flow and prevents carrier recombination at the interfaces. The layer 2 forming the barrier 3 may be an atomically compatible region with a difference in doping level in the same material, it may be a different semiconductor material having a larger bandgap forming a heterojunction or an electron repelling interface. The barrier height should be such that only a negligible number of electrons have a thermal energy sufficient to overcome the barrier. A magnitude of 4 times the measure standard in the art of KT where K is the Boltzmann coefficient and T is the temperature in degrees Kelvin is sufficient.

An opening 4 which exposes a portion of the semiconductor is provided out of which the electrons will escape into the surrounding environment. The escaping electrons 6 will cause a concentration gradient in the body 1 in the vicinity of the opening 4 which operates to drive electrons toward the opening 4.

The surface of the crystal 1 that is exposed in the opening 4 is covered with a material 5 that in juxtaposition operates to provide a negative electron affinity surface so that all electrons reaching the exposed surface of the crystal 1 in the opening 4 are propelled into the environment as monoenergetic electrons shown as arrows 6.

Figure 2:
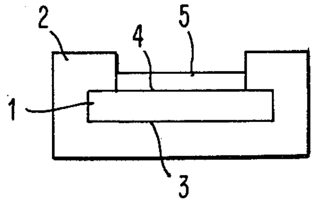
FIG. 2 is an illustration of the invention showing an extension of the barrier.

Referring to FIG. 2, a structure is illustrated where the barrier 3 is extended around the entire volume of the semiconductor body 1 and the opening 4 which contains the material 5 is arranged such that for the entire volume of the semiconductor 1 the path of an electron in the material is such that the electron will reach the opening 4. Such a structure will provide the maximum brightness and most efficient source of electrons. The term brightness for an electron emitting device may be defined as the intensity per square centimeter per steradian.

Figure 3:
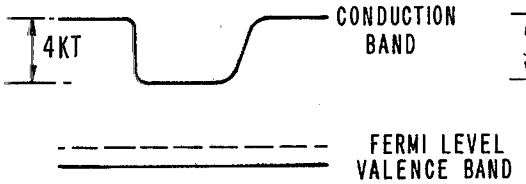
FIG. 3 is an energy level diagram of the device body.

Referring to FIG. 3, an energy level diagram is illustrated for FIG. 2 that is indicative of the energy influence on a carrier in the structure. In FIG. 3 the conduction band is higher over all the area covered by layer 2 except at the area of the opening 4. The result is an electron confinement barrier. The preferred barrier height is at least 4 KT.

The body 1, layer 2 and barrier 3 structure may be fabricated as follows. In the case where the barrier 3 is to be provided by different doping with the same conductivity, in a gallium arsenide example crystal, the body 1 is doped to $10^{16}/cm^3$ and the barrier layer is doped between $10^{18}$ to $10^{19}/cm^3$. In a second case where the barrier 3 is to be provided by providing a material for the layer 2 of a larger band gap, there are two examples. In the first example, the body 1 may be a gallium arsenide crystal and the layer 2 may be of an atomically compatible layer of gallium aluminum arsenide. In the second example, the layer 2 may be made of indium phosphide over an atomically compatible body 1 of indium arsenide phosphide forming a barrier 3 at the interface.

With the structure of FIGS. 1 and 2, electrons from hole-electron pairs generated in the semiconductor body 1 are confined in the semiconductor and move as illustrated by arrows 7 to the exposed surface at hole 4 where the negative electron affinity material 5 operates to eject them into the environment. The electrons are ejected essentially monoenergetically and are shown schematically as arrows 6. While all electrons within the diffusion distance during the carrier lifetime can migrate to the opening 4, in addition the departing electrons produce a concentration gradient in the semiconductor body 1 which operates to accelerate electrons along the direction of the arrows 7 toward the opening 4.

The electrons from the hole-electron pairs generated in the semiconductor 1 are repelled by the barrier 3 so that recombination at the interface of the semiconductor body 1 with an external layer, which has been a limitation of prior art structures, is inhibited by the structure of this invention.

Figure 4:
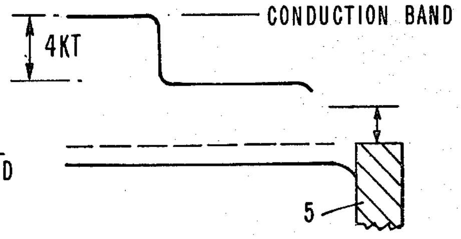
FIG. 4 is an energy level diagram involving the emission area.

Referring next to FIG. 4 wherein an energy level diagram is illustrated that is indicative of the energy levels that operate to emit electrons from the structure. The barrier labelled 4 KT operates to confine carriers everywhere except at the opening 4. At the opening area 4, the presence of the negative electron affinity material 5, having a work function that is less than the energy between the Fermi level and the conduction band of the semiconductor body 1, operates to cause the electrons to be propelled and emitted as a result of seeking the lowest energy level. The requirement for the negative electron affinity material 5 is that the "work function" property $\phi_S$ be less than the conduction band energy level $E_c$ less the Fermi energy level $E_f$ of the semiconductor body 1. This relationship is set forth in equation 1.

$$E_c - E_f > \phi_S \qquad \text{Equation 1}$$

Since the electrons pass through the negative electron affinity material 5, the thickness is frequently of monolayer coating order.

The semiconductor material selected for the member 1 may be monocrystalline p-conductivity type gallium arsenide and the barrier layer material 2 may be epitaxial p-conductivity type gallium alluminum arsenide which forms a hetero p-p junction barrier 3 of approximately 4 KT in magnitude. The hole 4 may be about 1 micron in diameter containing cesium oxide as the negative electron affinity material 5.

Figure 5:
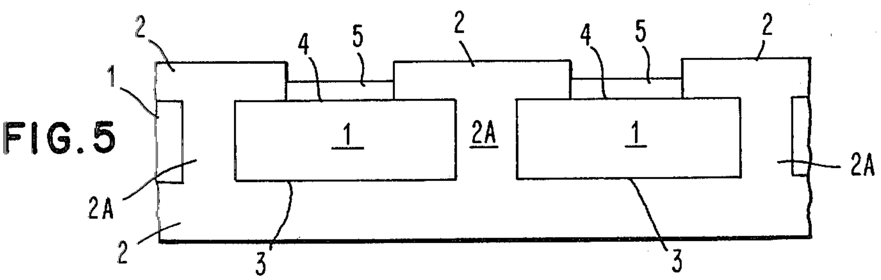
FIG. 5 is a schematic illustration showing the invention fabrication in an integrated circuit.

Referring next to FIG. 5 the structure of the invention may be fabricated using integrated circuit techniques. In such a situation the body 1 is a semiconductor crystal which is provided with the barrier material 2 both on the top and bottom. A semiconductor wafer, standard in the art, may be employed so that a broad area barrier 3 is formed both on the top and the bottom. In addition material 2A illustrated as isolating the individual devices may be, in accordance with the invention, a diffused or ion implanted doping, or a larger band gap material.

The structure of FIG. 5 may be fabricated by epitaxially growing a heterojunction for the barrier 3 using a material such as gallium aluminum arsenide for the barrier layer material 2 and using monocrystalline gallium arsenide for the semiconductor body 1. The isolating barriers 2A may be provided by ion implantation or an appropriate doping level.

As many openings 4 in the layer 2 as are desired may then be provided by standard lithographic techniques. When formation of the barrier material 2 with the holes 4 is complete, the holes 4 are then filled with the negative electron affinity material 5 by standard evaporating techniques. Some examples of negative electron affinity materials are cesium oxide, cesium fluoride, and rubidium oxide.

BEST MODE FOR CARRYING OUT THE INVENTION

Figure 6:
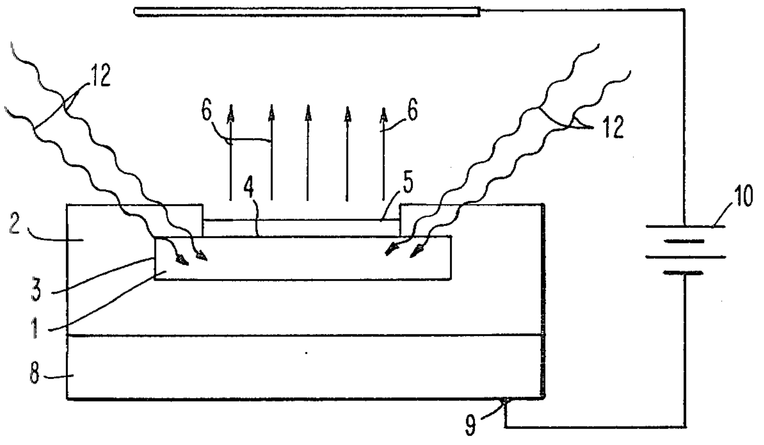
FIG. 6 is a schematic illustration showing the invention involving the generation of hole-electron pairs of irradiation.

Referring next to FIG. 6, an illustration is provided of the device of the invention wherein the hole-electron pairs in the semiconductor body 1 are generated by light radiation. The barrier layer material 2 surrounds the body 1 except for the opening 4 containing in contact with the surface of the body 1 the negative electron affinity material 5. A low resistivity region 8 for electrical contacting purposes is provided with an external electrode 9. A battery 10 provides a charge in the surrounding environment such as a vacuum, between the semiconductor 1 and a grid 11. The emitted electrons are shown as arrows 6.

In operation hole-electron pairs are generated by irradiating the semiconductor 1 with light 12. The wavelength of the light is at a value which penetrates the barrier material 2 and is absorbed forming hole-electron pairs in the body 1. The holes are majority carriers which travel into and through the material 2 and the external circuit whereas the electrons are repelled by the barrier 3. Under these conditions the holes travel in the direction of the electrode 9 whereas the electrons move to the opening 4 and are emitted.

If light 12 is a wide band source, the device emits electrons only for those photon energies less than the band gap of layer 2 and greater than or equal to the band gap of body 1 whereby the device may have parameters selected for operation as a band pass filter.

In an illustrative embodiment the semiconductor body 1 would be a crystal of p-conductivity type gallium arsenide with a doping level of about $10^{16}$. The layer 2 would be p-conductivity type gallium aluminum arsenide with a doping level of about $10^{16}$ or greater. The layer 8 would be higher conductivity p+ gallium arsenide with a doping level of the order greater than $10^{19}$. The negative electron affinity material 5 would be cesium oxide. The width dimension of the semiconductor body 1 would be in the vicinity of up to 50 microns, the thickness dimension would be in the vicinity of 2 microns, and the hole 4 dimension would be in the vicinity of 1 micron or greater.

Figure 7:
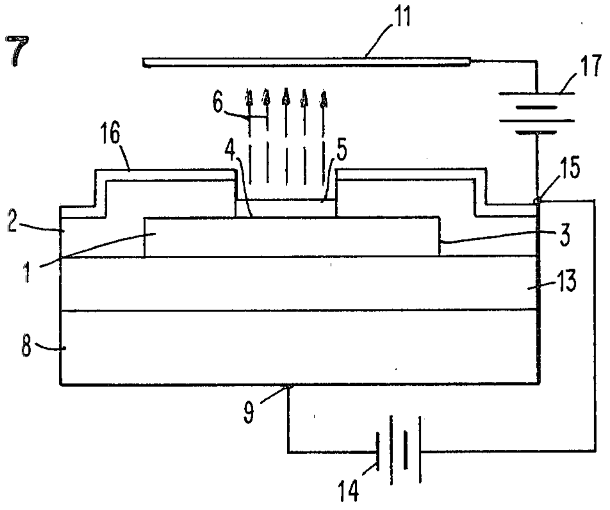
FIG. 7 is a schematic illustration showing the invention involving the generation of hole-electron pairs by electrical injection.

Referring next to FIG. 7. An illustration is provided of the structure of the invention adapted for hole electron pair generation through electrical injection.

In the structure of FIG. 7 the semiconductor body 1 is positioned on an opposite conductivity type heteromaterial substrate 13 so that electrons formed in the substrate 13 can be injected into the semiconductor body 1. The barrier layer material 2 is formed of the same conductivity type as the semiconductor body 1 but of the same hetero material as the material 13. The material 13 is then positioned on a high conductivity substrate 8 with a metal contact 9 and a battery 14 is employed to provide an electrical differential across the structure through a contact 15 and metallic layer 16 over the upper portion of the barrier layer material 2. The upper portion of the barrier layer material 2 and the metal layer 16 have an opening 4 with the negative electron affinity material 5 of cesium oxide therein. A second battery 17 provides a potential difference from the contact 15 to the grid electrode 11 in a vacuum environment.

In operation the structure as illustrated in FIG. 7 has electrons injected from the region 13 into the region 1 and those electrons are repelled by the barrier 3 between the barrier layer material 2 and the semiconductor 1 so that the only point of escape is through the negative electron affinity material 5 and out into the vacuum as monoenergetic electrons 6 which strike the collection grid 11.

A satisfactory structure involves p-type gallium arsenide for the semiconductor 1 doped to about $10^{16}$, n-type gallium aluminum arsenide for the region 13 doped to about $10^{18}$, p-type gallium aluminum arsenide doped to about $10^{19}$ for the region 2 and n-type gallium arsenide for the region 8 doped to about $10^{18}$. A metal ohmic contact 16 of gold-zinc alloy is provided over the region 2. The width dimension of the semiconductor 1 is approximately 50 microns or less, the thickness dimension is about 1 micron, and the diameter of the opening 4 is in the vicinity of 1 micron or greater.

The structure of the invention operates to provide a condition where the area of the body in which the electrons are being generated is larger than the area through which the electrons are being emitted. The result is a high efficiency device wherein excitation levels of 2000 amps (or watts) per square centimeter or 10 microamperes per square micron are achievable.

The efficiency of the device of the invention may be compared with existing devices in the following manner. Referring to FIG. 1, consider the area of the barrier 3 to be the area wherein electrons can be formed which may be referred to as the "pump area" ($A_p$) and consider the area of the opening 4 as the "emitting area" ($A_e$). In a device, the current density of the emitted electrons 6 (J) in amperes per square centimeter will be made up of the current density of the formed electrons or the pump current density ($J_p$) and the emitted current density ($J_e$). In all prior art cases the emitted current density $J_e$ is always less than or equal to the pump current density $J_p$. Under these conditions the emitted current 6 of FIG. 1 ($I_e$) may be expressed as equation 2.

$$I_e(6) = J_e \cdot A_e \qquad \text{Equation 2}$$

In a condition such as some prior art where $A_e = A_p$ such as where the area of the opening 4 covered the entire barrier area 3 all forms of internal losses such as diffusion away from opening 4 would reduce the efficiency. In this case $$I_e \leqq I_p \qquad \text{Equation 3}$$

and $$J_e \leqq J_p \qquad \text{Equation 4}$$

In a condition such that there was a smaller $A_e$ than that of $A_p$, the emitted current $I_e(6)$ would be the product of the pump current ($J_p$) and the ratio of $A_e$ over $A_p$. In this case surface recombination would cause reduced efficiency. In this case $$J_e \leqq J_p \qquad \text{Equation 5}$$

and the emitted current $I_e$ is less than or equal to the pump current density times the ratio of areas as set forth in Equation 6.

$$I_e \leqq I_p A_e / A_p \qquad \text{Equation 6}$$

In all prior art structures the emitted current density or brightness is limited by pump current density and the conversion efficiency of the device.

In the condition of the invention in contrast the emitting opening 4 ($A_e$) is smaller than the pump area ($A_p$) and all internal losses are controlled by the barrier layer 2 and the barrier so that the emitted current may be expressed by the equation 7.

$$J_e = J_p(A_p / A_e) \qquad \text{Equation 7}$$

An example configuration having $A_p$ with an area 10 microns on a side and a circular $A_e$ with a radius of 1 micron using $10^{16}$ doped gallium arsenide with a carrier lifetime length of 50 microns as set forth in App. Phys. Letters 49 (12) December 1978 the brightness improvement would be $A_p/A_e = 2500$.

What has been described is a structure wherein electrons from hole-electron pairs generated in a semiconductor are repelled by a barrier, confined and ejected through a negative electron affinity material so that the electrons are generated over a larger area than that from which they are emitted.

Having described the invention, what is claimed as new and what is desired to secure by Letters Patent is:

1. An electron source comprising in combination:

a p-type gallium arsenide semiconductor region in which hole-electron pairs can be generated, said region having the property of a specific electron diffusion length, an electron barrier layer of gallium aluminum arsenide on at least a portion of the surface thereof, said barrier layer having an emission opening exposing a portion of the surface of said semiconductor region, a negative electron affinity material in contact with the exposed surface of said emission opening, and means for generating hole electron pairs in said semiconductor region.

2. The electron source of claim 1 wherein said means of generating carriers is by irradiation.

3. The electron source of claim 1 wherein said means of generating hole-electron pairs is by electrical carrier injection.

4. The electron source of claim 1 wherein the material of said semiconductor region is gallium arsenide, said electron barrier forming layer material is epitaxial gallium aluminum arsenide of the same conductivity type as the material of said semiconductor region and said electron-hole pair injection is produced by injecting from an epitaxial injection region of gallium aluminum arsenide contiguous with a surface of said semiconductor region opposite to that of said opening, said injection region having a conductivity type opposite to that of the material of said semiconductor region.

5. In an electron emission device of the type wherein electrons present as excited non-equilibrium carriers in a p-type semiconductor are caused to be emitted through a confined emission surface area of said p-type semiconductor through a negative electron affinity material, the improvement comprising:

providing a p-conductivity type barrier region to excited non-equilibrium electron flow over at least the portion of the surface area of said p-type semiconductor surrounding said confined emission surface area.

6. The device of claim 5 wherein said barrier is formed between said p-type semiconductor and an atomically compatible p-type layer having at least one of a change in doping and a larger energy band gap.

7. The device of claim 5 wherein said barrier is of a potential of the order of at least 4 KT.

8. The device of claim 6 wherein said semiconductor is gallium arsenide and said barrier is formed between said gallium arsenide and at least one of an atomically compatible layer having a change in doping, or a larger energy band gap.

9. The device of claim 8 wherein said barrier forming layer is gallium aluminum arsenide.

10. The device of claim 6 where the semiconductor is indium arsenide phosphide and the barrier forming layer is indium phosphide.

* * * * *